CYCLIC POLYISOPRENE PHOTORESIST COMPOSITIONS

Filed Oct. 28, 1970 2 Sheets-Sheet 1

INVENTORS
DONALD L. KLEIN
MICHAEL W. Mac INTYRE
LAWRENCE J. ROTHMAN
BY Henry Powers
ATTORNEY June 13, 1972 D. L. KLEIN ET AL 3,669,669

CYCLIC POLYISOPRENE PHOTORESIST COMPOSITIONS

Filed Oct. 28, 1970

2 Sheets-Sheet 2

United States Patent Office 3,669,669
Patented June 13, 1972

3,669,669
CYCLIC POLYISOPRENE PHOTORESIST COMPOSITIONS

Donald L. Klein, Poughkeepsie, N.Y., Michael W. MacIntyre, South Burlington, Vt., and Lawrence J. Rothman, Poughkeepsie, N.Y., assignors to International Business Machines Corporation, Armonk, N.Y.

Filed Oct. 28, 1970, Ser. No. 84,833
Int. Cl. G03c *1/52*
U.S. Cl. 96—91 N 5 Claims

ABSTRACT OF THE DISCLOSURE

A cyclized polyisoprene/aryl bis-azide sensitized negative photoresist for semiconductor device manufacture containing a maximum of 1.3% sensitizer, and characterized by the three parameters (a) the percentage of uncyclized isoprene (or monomer) units as a function of sensitizer content, represented by the symbol R, where R=percent uncyclized polyisoprene/percent sensitizer.
(b) the ratio of internal to terminal double bonds in a cyclized material as a function of sensitizer represented by the symbol Q, where Q=IR absorbance of internal C=C/IR absorbance terminal C=C/percent sensitizer, and
(c) a combined sensitizer dependent figure of merit function K where K=QRS with the following maximum limits set to the parameters:

$Q_{max}=0.47$, $R_{max}=13.0$, and $K_{max}=7.94$

FIELD OF THE INVENTION

This disclosure relates to photosensitive compositions, and more particularly to negative photoresist compositions for use in photolithographic and photomechanical processes for photomasking systems employed in the fabrication of printed circuits, microcircuits, semiconductors, printing plates, dies and the like normally employed in other lithographic arts.

DESCRIPTION OF THE PRIOR ART

An extensive number of negative photosensitive or photoresist compositions are known or have been proposed for photomasking of various supports in the manufacture of printed circuits, microcircuits, semiconductors and the like as indicated above. Typical of such negative photoresist compositions are those described in U.S. Pat. No. 2,852,379 and No. 2,940,853.

In use, these negative photoresist compositions are first coated from solutions thereof by conventional methods, such as dipping, spraying, spin-coating and the like, on a suitable support on which the photoresist compositions are processed into suitable resist-masks for further processing of the substrate. Typically, these substrates may comprise a copper-coated phenolic board for making of printed circuits, or an oxidized surface of a semiconductor substrate for exposing the oxidized surface as required in manufacturing semiconductor devices. This photoresist coating is then exposed to light, e.g., ultra-violet, through a suitable mask in a pattern complementary to the area of substrated surface to be exposed, e.g., to the portion of the unexposed photoresist coating to be removed. The exposed portions of the photoresist becomes insolubilized, usually by cross-linking, permitting the unexposed portions of the photoresist coating to be dissolved or washed away by solvents in development of the photoresist mask. The exposed surface of the substrate may then be suitably treated as required, which typically may include etching of the above noted copper-clad and oxidized semiconductor substrates in the corresponding production of printed circuits and semiconductor devices. After processing of the substrate, the remaining photoresist coated mask may be removed with suitable solvents.

Among the more widely used photoresist compositions in the semiconductor industries are those comprised of cyclized polyisoprene and an aryl bisazide sensitizer such as described in the above noted U.S. Pats. 2,852,379 and 2,940,853. Although such photoresist compositions have enjoyed marked success in the manufacture of semiconductor devices (including integrated devices) in accordance with technologies here-to-date, such photoresist compositions have been, however, characterized with limitations in their proposed use with further miniaturization of semiconductor devices. Typical of such limitations is failure to provide the necessary resolution required in resist masks for delineation of line openings of the order of 2.5 microns or less in the oxide surface of semiconductor substrates, insufficient adhesion of the resist coating to the silicon oxide surface resulting in undercutting of the oxide during etching thereof, and limitations in solubility and structure which are reflected in obtaining proper thickness of resist coatings and development thereof which normally are employed in the order of 2,000 to 10,000 angstrom thickness.

In copending application U.S. Ser. No. 80,853, filed Oct. 15, 1970 for "Cyclic Polyisoprene Photoresist Compositions," and assigned to the assignee of this invention, the structure of the cyclized polyisoprene was optimized for use in photoresists of enhanced resolution in masking, solubility, developing, adhesion and etch resistance.

SUMMARY OF THE INVENTION

It has now been discovered, in accordance with this invention, that enhanced negative photoresist composition can be formulated by further correlation of the structures of the cyclized polyisoprene of the aforesaid copending application Ser. No. 80,853 as a function of sensitizer content of the photoresist compositions. More specifically, it was discovered that the photoresist compositions of this invention can be obtained by the indicated correlation defined by three chemical parameters R, Q and K where (a) R represents the precentage of uncyclized (linear) isoprene units as a function of sensitizer content represented by "S,"
(b) Q represents the ratio of cyclic internal and terminal C=C double bonds (as further identified below) in the cyclized polyisoprene as a function of the sensitizer content S, and
(c) K defines an empirical figure of merit value obtained from the relationship $K=QRS$, wherein the parameters are defined within critical limits set for the various independent and dependent variable involved therein.

Accordingly, it is an object of this invention to provide a novel photoresist composition;

Another object of this invention is to provide a novel negative photoresist composition comprised of cyclized polyisoprene and an aryl bisazide sensitizer.

A further object of this invention is to provide novel photosensitive elements comprised of a support coated with a layer of the photoresist compositions disclosed herein.

The foregoing and other objects, features and advantages of the invention will be apparent from the following more particular description of the present invention as illustrated in the accompanying drawings.

DESCRIPTION OF THE PREFERRED EMBODIMENTS

The foregoing objects are obtained, in accordance with this invention by a film-forming photosensitive composition comprised of an aryl bisazide sensitizer and cyclized polyisoprene polymer wherein the composition is circumscribed within the following critical parameter (a) the percentage of uncyclized (linear) isoprene units in the cyclized polymer as a function of sensitizer content, with the function represented by the variable R having a maximum value of 13.0, (b) the ratio of cyclic internal and terminal C=C double bond in the cyclized polymer as a function of sensitizer content with this relationship represented by the variable Q having a maximum value of 0.47, and (c) an empirical figure of merit (relationship) K represented by the function $K=QRS$ where K has a maximum value of 7.94. In addition it was found that in the photoresist compositions of this invention, the sensitizer content, represented by the variable S, must be limited to a maximum of 1.3 wt. percent, based on the combined polymer and sensitizer content.

Figure 1:
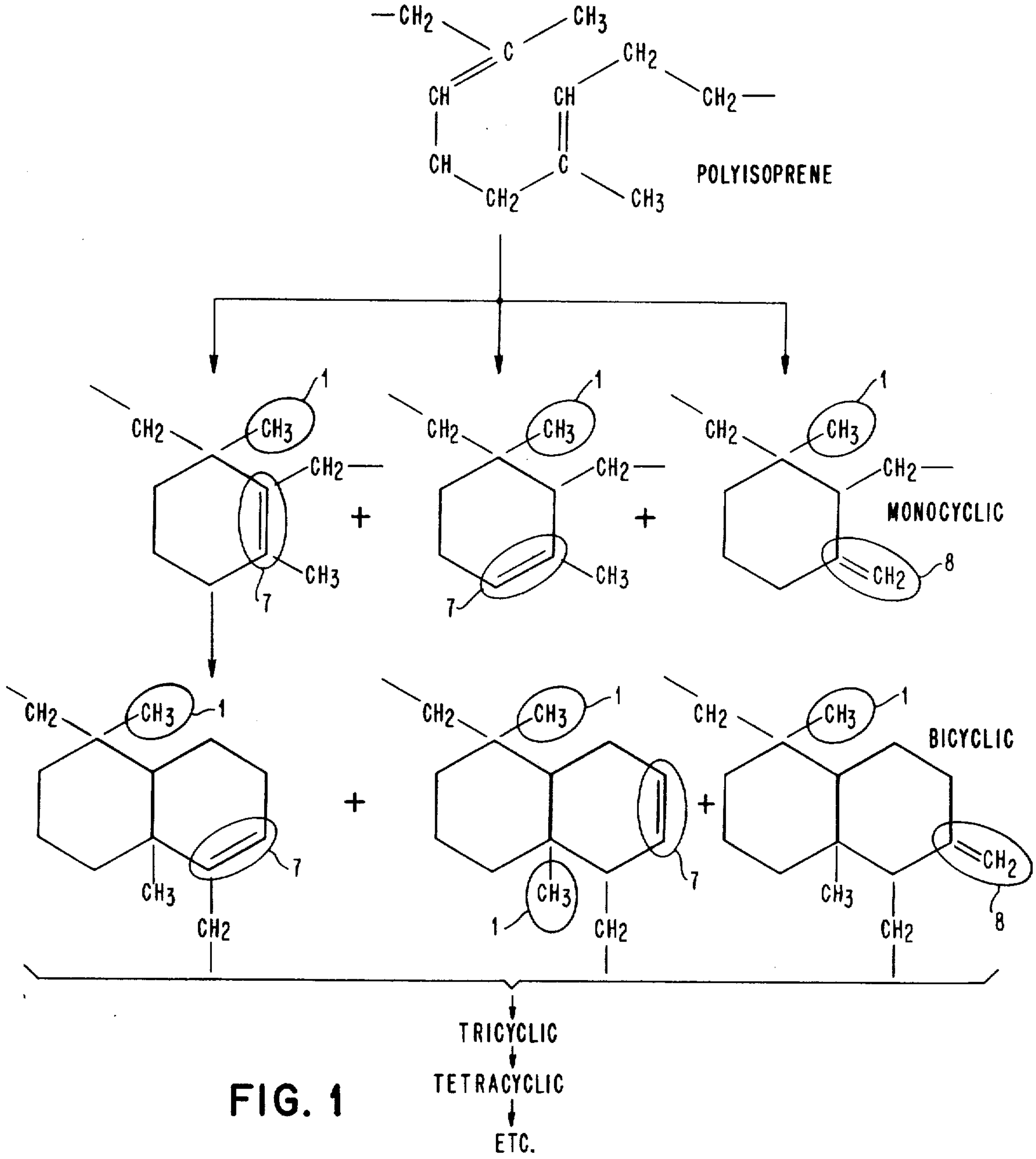
FIG. 1 shows the reaction scheme in the cyclization of polyisoprene.

Characterization of the photoresist composition of this invention was based on commercially procurred negative resists whose compositions were determined by conventional techniques. For example, the cyclicity ratio and the percent uncyclized isoprene (e.g. monomer) units was measured by the nuclear magnetic resonance (e.g. NMR) spectra based on a high temperature modification of the procedure of M. H. Golub, et al., described in "High Resolution Nuclear Magnetic Resonance Spectra of Various Polyisoprenes," Journal of the American Chemical Society, 84, 4981 (1962). The applicability of the NMR spectra to the measurement of polymer cyclicity ratio and percent uncyclized monomer units can be referenced to the progress of cyclization of cis-1,4-polyisoprene illustrated in FIG. 1 showing the variety of products obtained by procedures such as described J. J. Janssen in "Preparation and Use of Cyclized Rubber as a Stiffening Resin in Rubber," Rubber Age, February 1956, pp. 718–722.

The NMR procedure permits distinction between cyclic and acyclic C=CH moieties, and also distinguishes $CH_3$—C— moiety (e.g. 1 in FIG. 1) from other $CH_3$—, —$CH_2$—, and —CH proton singals. The spectrum is run on a filtered 20% weight/volume (w./v.) solution of precipitated polymer in $CCl_2{=}CCl_2$ at 120° C. with tetramethyl silane (e.g. TMS) internal reference. The polymer employed is precipitated from the resist formation by slowly dripping a 1:1 solution of the resist formulation in xylene which is slowly dripped into a ten-fold volume excess of vigorusly stirred methanol. The solid polymer is separated and vacuum dried at 35° C. for 48 hours for the NMR analysis.

The NMR signal intensities were measured by planimeter. Incompletely resolved signals were evaluated arbitrarily by dropping a perpendicular from the valley minimum between the signals to the base line with the intersection assigned the border between the signals. The spectral assignments are shown in FIG. 2 where 2 at about 5.3δ is the cyclized C═CH moiety, signal 3 at about 5.1δ is the uncyclized C═CH moiety, signal 4 at about 4.6δ is the cyclized C═$CH_2$ moiety, signal 5 from about 1.2δ to about 3.0δ represents the $CH_3$—$CH_2$ and

—CH moiety signal, but excluding the $CH_3$—C moiety (e.g. 1 in FIG. 1), and 6 from about 0.68 to about 1.28 is the $CH_3$—C— moiety signal (e.g. 1 in FIG. 1). For a more detailed description of the NMR procedure and spectra for cyclized cis-1,4-polyisoprene, reference is made to the aforesaid copending application Ser. No. 80,853.

Figure 2:
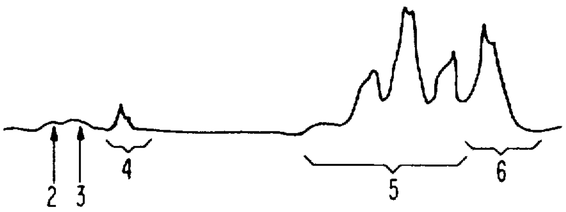
FIG. 2 shows the distribution in the NMR spectrum of various moieties in cyclized polyisoprene.

The cyclicity C of the polymer is determined from the ratio $$C=\frac{E}{T-8B}$$

where E is the intensity, at 6 in FIG. 2, of the $CH_3$—C—C moiety (e.g. 1 in FIG. 1), T is the total intensity under the curve of FIG. 2; and B is the intensity, at 3 in FIG. 2, of the uncyclized C═CH moiety. From this relationship the cyclicity ratio C for monocyclic polymers is found to be 0.19, with cyclicity ratios of 0.25 and 0.28 respectively for bicyclicity and tricyclicity. The percent uncyclized isoprene (e.g. monomer) units P is found from the relationship $$P=\frac{(8B)(10^2)}{T}$$

where B and T have the relationships indicated above.

The weight average molecular size. $A\bar{w}$, was measured by gel permeation chromotograph (GPC), in accordance with the procedure described by J. Cazes in "Gel Permeation Chromotography," Journal of Chemical Education, 43, Number 7, July 1966.

The gel permeation chromatography (GPC) on the cyclized cis-1,4-polyisoprenes was done in tetrahydrofuran with the Waters Associate Model 200 unit fitted with columns packed with crosslinked polystyrene gel of $10^5$, $10^4$, $7\times10^2$ A. sizes. The weight average molecular sizes ($A\bar{w}$) were measured by comparing the elution time with standard narrow molecular weight polystyrenes in the range of 48,000 to 117 A., and polyethylene glycol from 780 to 50.5 A.

The ratio P of the cyclic internal double C═C bonds, 7 in FIG. 1, to the terminal double C═C bonds, 8 in FIG. 1, was determined from the ratios of the infrared absorbance of these internal and terminal double bonds at 6.0 and 6.1 microns respectively, using the procedure of W. S. Richardson et al. as described in J. Poly. Sci., 10, 353 (1952). For this determination, the cyclized polyisoprene polymer was separated from the other constituents of the resist composition followed by dissolution of a weighed amount in a measured volume of chloroform. It is to be understood that reference to internal cyclic C═C and terminal cyclic C═C double bonds or moieties for purposes of this application and in the claims is defined by and restricted to the moieties 7 and 8, respectively, in FIG. 1.

In substance, the foregoing defines the various parameters required for delineating the photoresist compositions, necessitating only the determination of limits for A (the ratio of the infrared absorbance of the cyclic internal C═C bonds to the terminal C═C bonds) and P representing the percent of uncyclized isoprene units in the polymer, in view of the preceding assignment of limits to the figure of merit K, the parameters Q, R and the maximum concentration of sensitizer S.

As regards the specific sensitizer contained in the resist formulations employed in delineating the compositions of this invention, this was found, by analysis, to be 2,6-bis-(4'-azidobenzylidene)-4-methylcyclohexanone. Although a specific sensitizer has been identified, it is to be understood, however, that the resist composition of this invention comprehend the use of the various known aryl bis-diazide sensitizers such as described in the above noted U.S. Pats. 2,852,379 and 2,940,853. Typical of such sensitizers are 4,4'-diazidochalcone, 2,6-di-(4'-azidobenzylidene) cyclohexanone, 4,4'-diazidostilbene, p-phenylene-bis (azide), 4,4'-diazidobenzalphenone, 4,4'-diazidodiphenylmethane, and the like.

The relative proportions of the cyclized polyisoprene and the sensitizers may be varied as desired or as conditions may require, within the parameters of the invention specified herein, but ordinarily the proportions of polymer to sensitizer will be about 25 to 1 of the polymer and sensitizer. Usually the range of the sensitizer in the composition is from about 0.5 to about 1.3 weight percent. However, then the specific concentration of the sensitizer can generally vary over a wide range, but will ordinarily be dependent on the specific sensitizer used, on the thickness of the photosensitive layers desired or required, and on the specific applications of the photoinsolubilized layer. In each individual case, the optimum concentrations can be determined by techniques well known in the art.

In use, the photosensitive composition of this invention are applied as the solution, in a suitable solvent commonly employed in the art for coating of polymers on suitable supports used conventionally for photoresist elements. Typical solvents included the lower alcohols such as methanol, ethanol, propanol, etc., ketones such as cyclohexanone, 2-butanone, acetone, etc., dimethyl formamide, tetrahydrofuran, pyridine, benzene, toluene, etc., and mixtures thereof. In general any inert solvent may be employed in view of its sole function as a mere vehicle for coating the photosensitive compositions on a support element, and the selection of the solvent may include those enumerated above. The solids contents, e.g. of the composition need only be sufficient to provide the desired film thickness of the composition, which for resist coating thicknesses in the range from about 1,000 to about 15,000 angstroms.

Photoinsolubilization (e.g. cross-linking) of the polymer can be effected by simply exposing the polymer/sensitizer composition of this invention to a source of actinic radiation from any source out of any type. The light source need only furnish sufficient amount of radiation, preferably ultraviolet, to induce the desired insolubilization of the composition. Typical sources of light include carbon arcs, mercury vapor lamps, and the like. The effect of the sensitizer is not always to insolubilize the photoresist composition to all organic solvents, and in some cases it may be necessary to choose the developing solvent with a certain degrees of care. However, with the use of the photoresist composition of this invention, the choice of solvents is fairly wide.

The film-forming photosensitive composition of this invention can be coated on the support by any of the conventional methods used in the photoresist art which can include dipping, spraying, spin coating, etc. After application of the coating, the solvent is driven off, as by evaporation, to leave a thin coating of the photosensitive composition on the support, after which the coating may be exposed to suitable radiation in accordance with conventional techniques employed in the photomechanical and photolithographic arts. Typical supports include any various base materials to which the photosensitive compositions will adhere, such as glass, paper, resin, impregnated or reinforced paper, solid resinous sheets, metal sheets such as aluminum, zinc, magnesium, copper, etc., and the like.

After the support member has been coated with a film of the photosensitive composition and dried, it is then exposed to light (e.g. ultraviolet) in a predetermined pattern corresponding to the ultimate pattern desired. Generally such exposure is effected by means of suitable masks, negatives, stencils, templates, etc. In any event, such exposure induces photopolymerization or insolubilization of the coating in the exposed areas thereof. The exposed coating may then be developed by treating it in any suitable solvent such as listed above. Generally, because of the differential insolubility which has been induced, the solvent developer may be the same solvent in which the polymer and sensitizer were originally dissolved, i.e. prepared in. In the development stage, the unexposed areas are softened and dissolved off, leaving a resist image corresponding to the exposed areas in which photoinsolubilization was induced.

If desired, the coated plate or support may be subjected to optional heat treatments to enhance the resolution of the exposed areas. For example, the exposed coating may be prebaked at low temperatures, e.g. to about 90 to 100° C., for a short period of time, e.g. about 10 to about 60 minutes, to increase the polymerization of the coating. Also, a post-bake treatment may be employed after development to increase the strength of the resist image. For the post bake, the film and support may be oven-baked below the softening point of the support for suitable times (which illustratively may be of the order of about 140 to about 180° C. for about 10 to about 60 minutes) depending upon the further processing requirements of the support.

A typical application for the photosensitive composition of this invention is in the fabrication of semiconductor devices. In such an application, the photosensitive composition may be coated on an oxidized surface of a semiconductor substrate followed by exposure of the coating (after drying) in a predetermined pattern, via a mask corresponding to the area of the oxide desired to be bared for further processing. The exposed coating is then developed to bare the oxide layer for further processing which, for example, may then be conventionally etched into appropriate openings for diffusions, metallization or other operation as desired or required. Alternatively the support may comprise a passivated semiconductor device having diffused regions therein and including a layer of metal, e.g. aluminum (on the active surface of the device) adapted for defining a connection pattern therefrom. In such application, the photoresist composition of this invention is applied to the metal coating and suitably exposed in a pattern corresponding to the connection pattern desired for the device.

However, it is to be understood that the photosensitive compositions of this invention are also suitable for other uses. For example, they can be applied to the manufacture of printed circuits, chemical milling and in various general fields of photomechanical and photographic reproductions, lithography and intaglio printing, such as offset printing, silk screen printing, manifold stencil sheeting coatings, lithographic plates, relief plates, gravure plates and the like.

As indicated above, the full characterization of the photoresist composition of this invention required only the determination and assignment of limits for A (the ratio of the infrared absorbance of the cyclic interal C=C bonds to the terminal C=C bonds) and P, representing the percent of uncyclized isoprene units in the cyclized polymer. The limits for A were found from the observed function and since $Q=A/S$, where empirical maximum values have been previously assigned to Q and S as, respectively, 0.47 and 1.3, the function may be rearranged to $A_{max}=Q_{max}\,S_{max}$ where
$A=0.47\times1.3=0.611$ max.

Similarly, the maximum value for R was found from the observed function $$R=P/S$$

and since empirical maximum values have been found previously for R and S as, respectively, 13 and 1.3, the function may be rearranged to $P_{max}=R_{max}\cdot S_{max}$ where
$P_{max}=13\times 1.3=16.9$ max.

Accordingly, the maximum values of 0.611 are assigned to A and 16.9 are assigned to P. Correlation of the variables P, A and S in verification of the figure of merit K may also be found in the relationship $$K_{max.}=\frac{P_{max.}A_{max.}}{S_{max.}}$$

where $$K_{max.}=\frac{16.9\times 0.611}{1.3}=7.94 \text{ max.}$$

Figure 3:
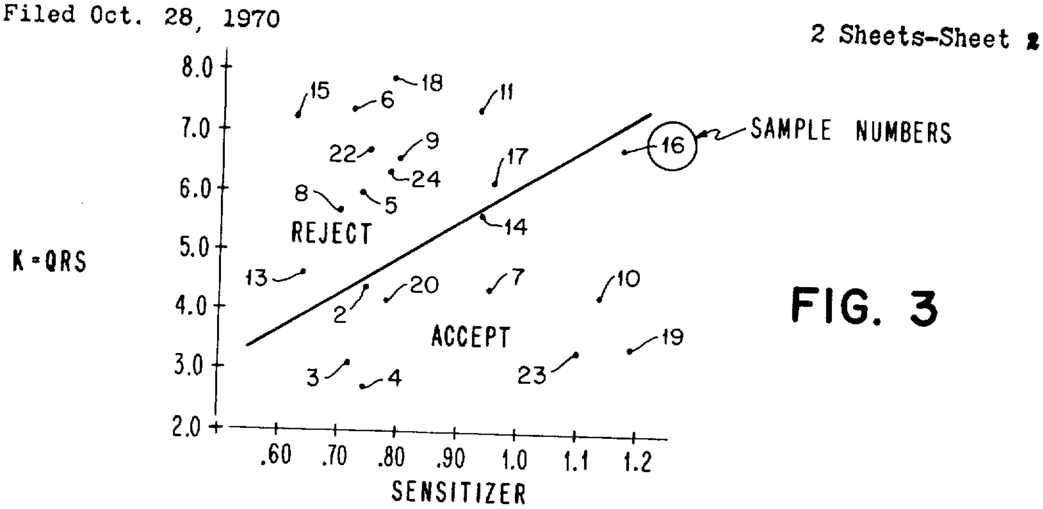
FIGS. 3 to 5 are graphs of various parameter relationships of the photoresists of this invention.
Figure 4:
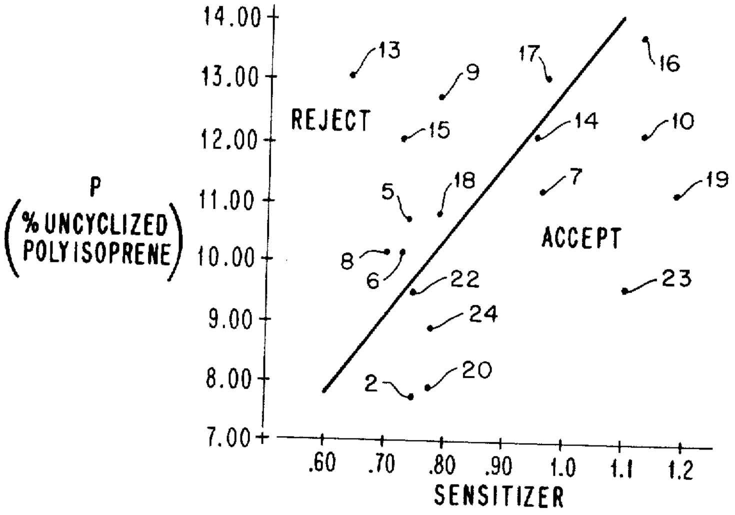
Figure 5:
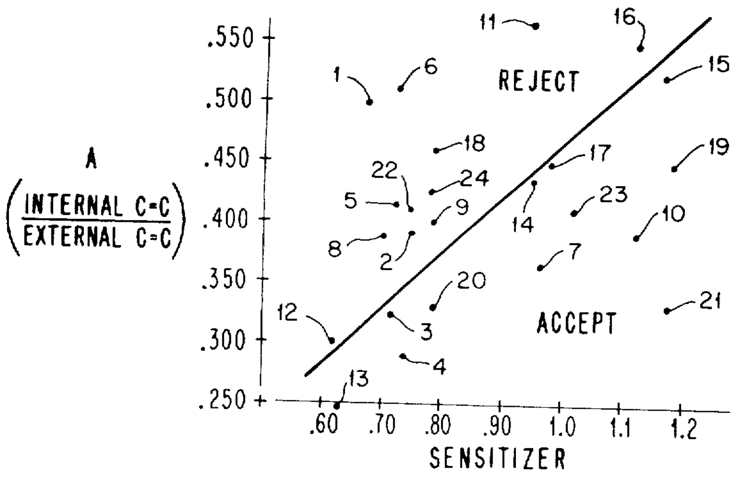

Graphs for the relationship of (a) figure of merit K as a function of sensitizer content, (b) the percent of uncyclized isoprene units as a function of sensitizer content in conformance to the maximum value R, and (c) the IR ratio of internal to terminal double C═C bonds in the cyclized polymer as a function of sensitizer content in conformance to the maximum value of Q are shown in FIGS. 3, 4 and 5 respectively.

Experimental verification was found in the photoresist compositions as characterized in the following table, wherein the photoresist comprised cyclized polyisoprene and a 2,6-bis-(4′-azidobenzylidene) - 4 - methylcyclohexanone sensitizer (photoinitiator).

2, 22, and 24 exceeded the maximum limits for Q while remaining within the maximum for R and K. Likewise, although Sample 13 remained within the maximum limits for Q and K, it was outside the maximum limit for R. Thus, from the 24 various samples characterized in the above table, only Samples 3, 4, 7, 10, 14, 16, 19, 20, 21 and 23 (e.g., only 10 of 24) qualified within the photoresist composition of this invention.

In addition, Table I above shows an additional parameter titled "Accept Ratio" which represents the ratio of the K calculated from the actual values of Q, R and S to the theoretical values along the curve of FIG. 3 based on the actual sensitizer content.

The foregoing photoresist compositions of Table I were subjected to five functional tests (e.g. pin hole, photosensitivity, adhesion, flow and resolution) to show the correlation thereof with the parameters defined. Tests for pin-hole were performed in accordance with the pyrocatechol-based etching method of M. V. Sullivan as described in the "Proceedings, Kodak Seminar on Microminiaturization," June 3–4, 1965, Rochester, N.Y. p. 30. A test for photosensitivity was performed in accordance with the method described by M. S. Htoo in "New Method for Photoresist Exposure Determination" presented at the 1967 Annual Meeting of the Society of Photographic Scientists and Engineers, Chicago, Ill., May 15–19, 1967.

The adherence of the resist was measured in terms of undercut of the top surface of the etched silicon oxide

TABLE I

| Sample | Cyclicity ratio | $A\bar{w}$, A [1] | P [2] | A [3] | S [4] | Q [5] | R [6] | Figure of merit K: $K_c$ [7] | Figure of merit K: $K_t$ [8] | Accept ratio ≤1.00 [9] | Pass/Fail [10] |
|---|---|---|---|---|---|---|---|---|---|---|---|
| 1 | 1.91 | 2,694 | 15.61 | .50 | .27 | .75 | 23.30 | 11.71 | 4.1 | 2.86 | F |
| 2 | 1.26 | 5,854 | 8.73 | .39 | .75 | .52 | 11.64 | 4.54 | 4.36 | .99 | F |
| 3 | 1.14 | 4,940 | 7.08 | .32 | .71 | .45 | 9.97 | 3.19 | 4.37 | .73 | P |
| 4 | 1.41 | 4,945 | 7.64 | .29 | .74 | .39 | 10.22 | 2.98 | 4.56 | .66 | P |
| 5 | 1.82 | 6,576 | 10.77 | .41 | .73 | .56 | 14.75 | 6.03 | 4.50 | 1.34 | F |
| 6 | 1.25 | 4,493 | 10.15 | .52 | .72 | .72 | 14.20 | 7.31 | 4.41 | 1.66 | F |
| 7 | | | 11.21 | .37 | .96 | .31 | 11.68 | 4.37 | 5.90 | .74 | P |
| 8 | | 4,458 | 10.15 | .39 | .70 | .56 | 14.49 | 5.68 | 4.30 | 1.32 | F |
| 9 | 2.17 | | 12.78 | .40 | .79 | .51 | 16.81 | 6.52 | 4.91 | 1.33 | F |
| 10 | 1.82 | | 12.21 | .39 | 1.12 | .35 | 10.90 | 4.27 | 6.87 | .62 | P |
| 11 | 2.10 | 4,532 | 15.00 | .56 | .93 | .49 | 16.13 | 7.35 | 5.70 | 1.29 | F |
| 12 | 1.94 | 5,392 | 15.88 | .30 | .62 | .48 | 25.61 | 7.62 | 3.80 | 2.01 | F |
| 13 | 1.77 | 4,405 | 13.09 | .24 | .64 | .38 | 20.45 | 4.97 | 3.92 | 1.26 | F |
| 14 | 1.66 | 4,003 | 12.18 | .44 | .94 | .47 | 12.95 | 5.72 | 5.75 | .99 | P |
| 15 | 1.05 | 4,758 | 12.07 | .53 | .72 | .74 | 16.76 | 8.93 | 4.41 | 2.02 | F |
| 16 | 1.17 | 4,698 | 13.71 | .55 | 1.17 | .47 | 12.24 | 6.72 | 7.17 | .94 | P |
| 17 | 1.15 | 4,683 | 13.17 | .45 | .96 | .49 | 13.72 | 6.19 | 5.90 | 1.04 | F |
| 18 | | | 10.83 | .46 | .79 | .58 | 13.71 | 7.95 | 4.85 | 1.64 | F |
| 19 | 1.17 | | 11.22 | .45 | 1.19 | .38 | 9.43 | 3.58 | 7.30 | .49 | P |
| 20 | | | 7.93 | .33 | .78 | .42 | 10.17 | 4.27 | 4.80 | .89 | P |
| 21 | 1.23 | | 6.68 | .33 | 1.17 | .29 | 5.86 | 1.70 | 7.00 | .24 | P |
| 22 | 0.99 | | 9.40 | .41 | .75 | .54 | 12.53 | 6.77 | 4.60 | 1.47 | F |
| 23 | 1.14 | | 9.63 | .41 | 1.10 | .37 | 8.75 | 3.56 | 6.72 | .53 | P |
| 24 | 0.92 | | 8.97 | .43 | .78 | .55 | 11.50 | 6.33 | 4.80 | 1.32 | F |

LEGEND:
[1] $Aw$=GPC average molecular size, angstroms, A.
[2] P=Percent uncyclized isoprene units=16.9 maximum.
[3] A–IR absorbance internal C═C/IR absorbance terminal C═C=0.611 maximum.
[4] S=IR wt. percent Sensitizer=1.3% max.
[5] Q=A/S=0.47 maximum.
[6] R=P/S=13.0 maximum.
[7] $K_c$=PA/S calculated=13.0 max.
[8] $K_t$=PA/S theoretical from graph on FIG. 3.
[9] Accept ratio=$K_c/K_t\geq 1.00$.
[10] Pass/Fail=Reflects accept ratio.

In the foregoing Table I, the theoretical $K_T$ was calculated from the relationship $K_T=6.11\times S$ where S is percent sensitizer.

As will be noted in the table, each of samples was within the parameters set for P, A, and S representing percent uncyclized isoprene units, ratio of the IR absorbances of internal C═C bonds to terminal C═C bonds and percent sensitizer, respectively. However, it will be noted that the samples varied out of the parameters set for Q, R and K as above identified. For example, in Samples 1, 15 and 18, each exceeded the maximum limit set for Q, R and K; in Samples 5, 6, 8, 9, 11, 12 and 17, each exceeded the maximum limit for Q and R although remaining within the limits for the figure of merit K. Similarly, Samples ($SiO_2$) layer in relation to standard post baked resist image boundary at the resist-$SiO_2$ interface. It is reported in micrometers undercut per side and includes the normal lateral etch for the process. The measurement is made at four referenced locations on each wafer before and after etching. Two wafers were used for each resist formulation, producing eight individual undercut determinations. A single undercut value for each material is the average of the eight individual determinations. The adherence of the resist is determined by measurement of the lateral dimension of developed resist lines coated on silicon oxide coatings formed on a silicon substrate. The exposed silicon oxide between the develop line of the resist coatings was etched, the resist stripped, and the lateral dimensions of the retained silicon oxide were measured. The difference in measurement in micrometers between the resist image and the oxide image divided by two represents the undercutting providing a corresponding measurement of the adherence of the photoresist.

Image flow characteristics were determined by obtaining suitable photo-micrographs of the resist image before and after a special post bake operation for observation of change of the size of resist image openings. Four geometries were observed which were approximately 1.0, 1.3, 1.7 and 2.0 micrometer lines and spaces. For these determinations, silicon oxidized wafers were spin coated with the resist formulations of Table I at 3,000 r.p.m. for 45 seconds to obtain resist thicknesses of approximately 5,000 angstroms. The resist was prebaked in a quartz boat on an aluminum block for 30 minutes in 100° C. ±5° C. The prebaked wafers were exposed at 1½, 1¾ and 2 seconds using an Ealing transparency. The exposed wafers were then developed in 20% cyclohexanone/80% xylene developer which was magnetically stirred for two minutes. The developed resist temperatures were then rinsed in n-butyl acetate and jet air dried. After drying, photographs were taken at 635× magnification for resolution evaluation. The wafers were then loaded in a quartz boat for post baking in a 180° C. oven for 30 minutes on an aluminum block. After post bake, photographs were again taken at 635 × magnification for resist flow evaluation. Control limits for image resolution and flow were determined by the ability to obtain open geometries of 1.5 micrometers or less, with flow determined by the retention of open geometries of 1.7 micrometers and less. The results of these functional tests are set below in Table II.

TABLE II

| Sample | Pass/Fail | | | | |
|---|---|---|---|---|---|
| | Pinholes | Photosensitivity | Flow | Adhesion | Resolution |
| 1 | No test | Fail | No test | No test | No test. |
| 2 | Fail | No test | Pass | Pass | Pass. |
| 3 | Pass | do | do | do | Do. |
| 4 | do | do | do | do | Do. |
| 5 | Fail | do | do | do | Do. |
| 6 | do | do | Fail | do | Fail. |
| 7 | Pass | Pass | Pass | do | No test. |
| 8 | do | Fail | do | do | Pass. |
| 9 | Fail | do | do | do | Do. |
| 10 | Pass | Marginal | do | do | Do. |
| 11 | Fail | Pass | do | do | Do. |
| 12 | do | Fail | do | do | Do. |
| 13 | do | do | Fail | do | Do. |
| 14 | Pass | Pass | Pass | do | Do. |
| 15 | Fail | do | Fail | do | Do. |
| 16 | Pass | do | Pass | do | Do. |
| 17 | Fail | do | do | do | Do. |
| 18 | do | do | Marginal | do | Do. |
| 19 | Pass | do | Pass | do | Do. |
| 20 | do | do | do | do | Do. |
| 21 | do | do | do | do | Do. |
| 22 | do | do | do | do | Do. |
| 23 | do | do | do | do | Do. |
| 24 | Fail | Marginal | Fail | do | Do. |

While the invention has been particularly shown and described with reference to preferred embodiments thereof, it will be understood by those skilled in the art that the foregoing and other changes in form and details may be made therein without departing from the spirit and scope of the invention.

What is claimed is:

1. A film-forming photo-resist composition comprising an aryl bis-diazide sensitizer and cyclized cis-1,4-polyisoprenes having a maximum weight average molecular size $A\bar{w}$ of about 4,000 to about 5,500 angstroms with said composition conforming to the relationships (a) $Q=A/S=0.47$ maximum,
(b) $R=P/S=13.0$ maximum,
(c) $K=QRS=7.94$ maximum, where
  (i) A is the infrared absorbance ratio of internal to terminal cyclic C=C double bonds in said polyisoprene, and has a maximum value of 0.611,
  (ii) S is the wt. percent of said sensitizer based on the combined wt. of said sensitizer and polymer, and has a maximum value of 1.3 wt percent, and
  (iii) P is the percent of uncyclized isoprene units in said polymer, and has a maximum value of 16.9%.

2. A light sensitive element comprising a support coated with a film having the composition of claim 1.

3. The light sensitive element of claim 2 wherein said support comprises a semiconductor substrate having a dielectric layer thereon with said layer disposed adjacent said film.

4. The element of claim 3 wherein said film is silicon dioxide.

5. The light sensitive element of claim 2 wherein said support comprises a semiconductor substrate having a coating of metal thereon therefrom with said coating disposed adjacent said film.

References Cited

UNITED STATES PATENTS

| | | | |
|---|---|---|---|
| 2,852,379 | 9/1958 | Hepher et al. | 96—91 |
| 2,940,853 | 6/1960 | Sangura et al. | 96—75 |
| 3,591,378 | 7/1971 | Altman | 96—91 |

OTHER REFERENCES

Levine et al., Kodak Photoresist Seminar Proceedings, 1968 Ed., vol. 1, pp. 16, 17.

NORMAN G. TORCHIN, Primary Examiner

J. WINKELMAN, Assistant Examiner

U.S. Cl. X.R.

96—75, 115 R, 36.2